United States Patent
Gaskins

(10) Patent No.: US 7,444,570 B2
(45) Date of Patent: Oct. 28, 2008

(54) APPARATUS AND METHOD FOR CONTROLLING FREQUENCY OF AN I/O CLOCK FOR AN INTEGRATED CIRCUIT DURING TEST

(75) Inventor: Darius D. Gaskins, Austin, TX (US)

(73) Assignee: Via Technologies, Inc., Taipei (TW)

( * ) Notice: Subject to any disclaimer, the term of this patent is extended or adjusted under 35 U.S.C. 154(b) by 386 days.

(21) Appl. No.: 11/379,958

(22) Filed: Apr. 24, 2006

(65) Prior Publication Data

US 2007/0079194 A1    Apr. 5, 2007

Related U.S. Application Data

(60) Provisional application No. 60/716,617, filed on Sep. 13, 2005.

(51) Int. Cl.
*G01R 31/28* (2006.01)

(52) U.S. Cl. .................... 714/731; 714/726; 714/30; 714/34; 714/707; 714/701; 714/724; 714/744; 702/89; 702/106; 702/125

(58) Field of Classification Search .................. None
See application file for complete search history.

(56) References Cited

U.S. PATENT DOCUMENTS

| 5,673,295 A | 9/1997 | Read et al. |
|---|---|---|
| 5,774,703 A * | 6/1998 | Weiss et al. ............... 713/501 |
| 5,784,599 A * | 7/1998 | Elkhoury ................... 713/501 |
| 5,805,608 A * | 9/1998 | Baeg et al. ................. 714/726 |
| 6,195,772 B1 * | 2/2001 | Mielke et al. ............. 714/724 |
| 6,201,448 B1 * | 3/2001 | Tam et al. ................. 331/25 |
| 6,704,892 B1 * | 3/2004 | Kurd et al. ............... 714/724 |
| 6,954,097 B2 | 10/2005 | Harrison |
| 7,257,756 B2 * | 8/2007 | Wolff et al. ............... 714/744 |
| 2002/0135393 A1 * | 9/2002 | Jones et al. ............... 324/765 |
| 2003/0084390 A1 * | 5/2003 | Tamarapalli et al. ........ 714/744 |
| 2004/0085082 A1 * | 5/2004 | Townley ................... 324/765 |
| 2005/0210341 A1 * | 9/2005 | Chiba et al. ............... 714/701 |

* cited by examiner

*Primary Examiner*—John P Trimmings
(74) *Attorney, Agent, or Firm*—Gary R. Stanford; Richard K. Huffman; James W. Huffman

(57) ABSTRACT

A test system including a device under test (DUT) and a tester, where the DUT includes I/O interface logic and a clock circuit. The clock circuit includes a core clock circuit, a pad clock circuit, a test clock circuit, and a select circuit. The core clock circuit generates a core clock signal enabling full speed operation of core circuitry of the IC during test mode. The pad clock circuit generates a preliminary clock signal suitable for normal operation, and the test clock circuit generates a test clock signal suitable for operating the I/O interface logic during the test mode. The select circuit selects, based on the test signal, between the test clock signal and the preliminary clock signal as the pad clock signal. The tester provides the bus clock signal and indicates the test mode to the DUT via the I/O interface logic.

20 Claims, 2 Drawing Sheets

APPARATUS AND METHOD FOR CONTROLLING FREQUENCY OF AN I/O CLOCK FOR AN INTEGRATED CIRCUIT DURING TEST

CROSS-REFERENCE TO RELATED APPLICATIONS

This application claims the benefit of U.S. Provisional Application Ser. No. 60/716,617, filed on Sep. 13, 2005, which is herein incorporated by reference for all intents and purposes.

BACKGROUND OF THE INVENTION

1. Field of the Invention

The present invention relates to microprocessor testing, and more particularly to an apparatus and method for controlling an input/output (I/O) clock for an integrated circuit (IC) during test during test which runs the IC under test at optimum core clock frequencies using test equipment with limited system bus capabilities.

2. Description of the Related Art

On most integrated circuit testers, and more particularly those which are employed to test microprocessor devices, the device under test is inserted into a test fixture which simulates and monitors input/output (I/O) signals of the device to determine if it is working properly. In the case of a microprocessor, for example, the tester generates and monitors all of the I/O signals that are required to interface the microprocessor to remaining components within a computer system. One skilled in the art will appreciate that the core frequency at which a present day microprocessor operates is a multiple of the frequency of the bus clock frequency that is provided by a conventional tester. In addition, one skilled in the art will appreciate that present day testers are limited in terms of the speed at which they can generate and monitor those signals interfaced to the microprocessor. For example, a present day system bus (e.g., front side bus in an x86-compatible microprocessor) operates at speeds up to 800 megahertz (MHz), yet present day low-cost testers are only able to provide for system bus speeds up to 400 MHz. The tester is primary configured to test the core circuitry of the integrated circuit (IC) or microprocessor at the highest frequency possible rather than the I/O interface for the system bus, which may be properly tested with other means.

Thus, if a 50 MHz bus clock signal is generated by a tester to a microprocessor under test that is designed to respond to bus clock frequencies up to 100 MHz, then provisions must be made in the design of the microprocessor to enable its core logic to operate at full speed during test. In present day systems, techniques for doing this include providing for clock frequency ratio values that are enabled and exclusively employed during test. To illustrate, consider a microprocessor that is designed to accept a 100 MHz bus clock signal with a maximum clock ratio value equal to 32 in which the value 32 is used to multiply the frequency of the bus clock. At the high end, the processor is designed to operate at up to 3.2 gigahertz (GHz). But with a 50 MHz bus clock signal that is generated by a tester, the maximum obtainable core clock speed is 1.6 GHz using the clock ratio of 32. Accordingly, one approach to increasing the core speed of the microprocessor of this example is to increase the clock ratio value to 64, which can be enabled and specified only during test. Thus, when a 50 MHz bus clock signal is provided by a tester, the multiplier of 64 is employed to increase the internal core clock speed up to 3.2 GHz.

The conventional approach for increasing the core clock frequency of a device under test is problematic from several standpoints. First, the present inventor has noted that advances in the art to provide for faster core clock frequencies have driven designers to employ logic elements and circuits within these devices which are highly tuned to a range of conditions surrounding the optimum. In the case of a device that derives an internal core clock as an integral multiple in frequency of an externally provided bus clock, phase-locked loop (PLL) circuits are employed that are designed to provide spectrally pure core clocks within the range of clock multiples provided for by the device. For example, consider a microprocessor that is designed to accept a 100 MHz bus clock and to generate a core clock up to a multiple of 32. The particular PLL that is employed thus operates optimally for clock multiples up to 32. Now, one skilled in the art will appreciate, as does the present inventor, that most present day PLL circuits will allow for increasing the clock multiplier beyond this value such that higher core clock frequencies can be provided responsive to lower frequency bus clock signals. But it has been observed that pushing the PLL circuits in this manner is disadvantageous because the resulting core clocks exhibit spectral impurities (e.g., jitter) which, when applied to sensitive internal logic devices, may cause failures of the device under test that are due only to the degraded core clock that is being generated in a non-optimal region of multiples for a given PLL.

It is desired to test an IC, including microprocessors, at optimum core clock speeds using a frequency limited bus clock provided by a tester to which the IC is coupled.

SUMMARY OF THE INVENTION

An integrated circuit (IC) according to an embodiment of the present invention includes input/output (I/O) interface logic and a clock circuit. The I/O interface logic receives an external bus clock signal having a first frequency, receives and operates according to a pad clock signal, and is configured to detect a test mode and to internally provide a test signal if the test mode is detected. The clock circuit includes a core clock circuit, a pad clock circuit, a test clock circuit, and a select circuit. The core clock circuit generates a core clock signal at a second frequency based on the bus clock signal and a first clock ratio value. The pad clock circuit generates a preliminary clock signal at a third frequency based on the bus clock signal and a second clock ratio value. The test clock circuit generates a test clock signal at a fourth frequency based on the first frequency, the second clock ratio value and a third clock ratio value in which the fourth frequency is suitable for operating the I/O interface logic during the test mode. The select circuit selects, based on the test signal, between the test clock signal and the preliminary clock signal as the pad clock signal.

The external bus clock signal is provided at a frequency which, when multiplied by the first clock ratio value, generates the core clock signal to enable full speed operation of core circuitry of the IC. The pad clock circuit generates the preliminary clock signal at a frequency which is suitable for operating the I/O interface logic during normal mode, but which is too high for a tester during the test mode. The test clock circuit generates the test clock signal at the fourth frequency which is suitable for the tester during test mode. In this manner, the tester is able to test the core circuitry of the IC at full speed while avoiding excessive frequency of operation between the tester and the IC.

In one embodiment, the core clock circuit includes a frequency divider, a phase comparator, and a voltage controlled oscillator. The frequency divider divides the second frequency of the core clock signal by the first clock ratio value to provide a divided clock signal. The phase comparator compares phases of the bus clock signal and the divided signal and provides a phase indication signal. The voltage controlled oscillator has an input receiving the phase indication signal and an output providing the core clock signal. The pad clock circuit may be implemented in a similar manner to include a frequency divider, a phase comparator, and a voltage controlled oscillator. In this case, the second frequency divider divides the third frequency of the preliminary clock signal by the second clock ratio value to provide a divided clock signal. The phase comparator compares phases of the bus clock signal and the divided signal and provides a phase indication signal. The voltage controlled oscillator has an input receiving the phase indication signal and an output providing the preliminary clock signal.

The test clock circuit may include a computation block and a frequency divider. The computation block multiplies the first and third clock ratio values together and divides by the second clock ratio value to provide a test clock ratio value. The frequency divider divides the second frequency of the core clock signal by the test clock ratio value to provide the test clock signal.

In one embodiment, at least one external clock ratio signal is received via the I/O interface logic during the test mode which is used to derive the first and third clock ratio values. In an alternative embodiment, the second and third clock ratio values are preconfigured on the IC.

A test system according to an embodiment of the present invention includes a device under test and a tester, where the device under test includes I/O interface logic and a clock circuit. The clock circuit includes a core clock circuit, a pad clock circuit, a test clock circuit, and a select circuit similar to that described above. The tester provides the bus clock signal and indicates the test mode to the device under test via the I/O interface logic.

The tester may provide a clock ratio signal to the device under test via the I/O interface logic. The device under test may derive the first and third clock ratio values from the clock ratio signal. The second and third clock ratio values may be preconfigured on the device under test. The core and pad clock circuits may each be configured as phase-locked loop circuits. The tester may be capable of operating up to a frequency that is greater than or equal to the fourth frequency but less than the third frequency. The tester may interface the I/O interface logic according to a virtual frequency that is determined by dividing the first frequency by the third clock ratio value. The test clock circuit may include a frequency divider which divides the second frequency of the core clock signal by a fourth clock ratio value based on the first, second and third clock ratio values.

A method of testing an integrated circuit (IC) according to an embodiment of the present invention enables testing core circuitry of the IC while avoiding excessive frequency between a tester and the IC. The IC has a clock input for receiving a bus clock signal up to a first frequency, internal core circuitry operative up to a second frequency which is a first multiple of the first frequency, and an I/O interface operative up to a third frequency which is a second multiple of the first frequency. The method includes providing the bus clock signal to the IC at the first frequency and providing the first multiple to the IC to enable operation of the internal core circuitry up to the second frequency, programming the IC to operate in a test mode via the I/O interface, providing a test clock signal at a fourth frequency which is reduced relative to the third frequency by a third multiple, and providing the test clock signal to the I/O interface within the IC when in the test mode.

The method may include determining the third multiple as a ratio between the first frequency and a frequency of a virtual bus clock used for testing the IC. The method may include providing the third multiple to the IC as a ratio between the first frequency and a frequency of a virtual bus clock used for testing the IC, and determining the fourth frequency by dividing the second frequency by a fourth multiple which is determined as the first and third multiples multiplied together and divided by the second multiple. The may include providing the third multiple to the IC as a ratio between the first frequency and a frequency of a virtual bus clock used for testing the IC, and determining the fourth frequency by dividing the first frequency by a fourth multiple which is determined as a ratio between the second and third multiples. The method may include providing a test indication via the I/O interface and asserting a test signal within the IC in response to the test indication.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventor has noted that noted that advances in the art to provide for faster core clock frequencies have driven designers to employ logic elements and circuits within these devices which are highly tuned to a range of conditions surrounding the optimum. The present inventor has further noted that although most present day PLL circuits allow for increasing the clock ratio value beyond the optimum value, such practice is disadvantageous because the resulting core clocks exhibit spectral impurities which may cause failures of the device under test that are due only to the degraded core clock that is being generated in a non-optimal region of multiples for a given PLL. He has therefore developed an apparatus and method for controlling the frequency of an I/O clock for an IC during test which enables testing of the device at optimum core frequency in the presence of a frequency limited bus clock provided by a testing device, as will be further described below with respect to FIGS. 1-3.

Figure 1:
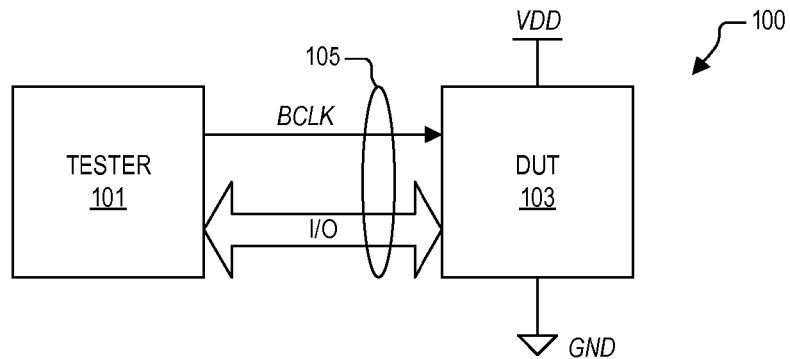
FIG. 1 is a simplified block diagram of a test system implemented according to an exemplary embodiment of the present invention.

FIG. 1 is a simplified block diagram of a test system 100 implemented according to an exemplary embodiment of the present invention. The test system 100 includes a tester 101 coupled to a device under test (DUT) 103 via a system bus 105. The DUT 103 is an integrated circuit (IC) or the like which is plugged into a test fixture (not shown) of the tester 101 for purposes of testing the device as understood by those skilled in the art. The tester 101 provides the appropriate voltages to provide full power the particular DUT 103 (e.g., VCC and ground or GND signals). The DUT 103 is any type of internally clocked IC, such as a microprocessor or the like. The tester 101 interfaces the DUT 103 via the system bus 105, which includes a bus clock signal BCLK along with multiple input/output (I/O) signals. On many integrated circuit testers, and more particularly those which are employed to test microprocessor devices, the tester 101 simulates and monitors the I/O signals of the DUT 103 to determine if it is working properly. In the case of a microprocessor, the tester 101 generates and monitors all of the I/O signals that are required to interface the microprocessor to remaining components within a computer system. The I/O signals of a microprocessor typically include address buses, data buses, I/O buses, etc. and various control signals, such as RESET, address and data strobes, busy signals, ready signals, etc.

The DUT 103 internally operates at a "core" frequency which is a multiple of the frequency of the externally provided bus signal BCLK that is generated and provided by the tester 101. The tester 101 is limited in terms of the speed at which it generates and monitors those signals interfaced to the DUT 103. For example, a present day system bus (e.g., front side bus in an x86-compatible microprocessor) operates at speeds up to 800 megahertz (MHz), yet present day low-cost testers, including the illustrated tester 101, are only able to provide for system bus speeds up to 400 MHz. An x86-compatible microprocessor configured to receive a bus clock signal up to 100 MHz, for example, supports "quad-pumped" transactions on its processor bus which internally multiply the frequency of the BCLK signal by eight for an effective frequency of operation up to 800 MHz. The tester 101, however, operates up to a maximum bus frequency, such as 400 MHz. It is possible to reduce the frequency of the BCLK signal (such as by half, e.g., 50 MHz) to enable testing. Yet reducing the frequency of BCLK also reduces the operating frequency of the core circuitry of the DUT 103, so that it would not be tested at full speed. Alternatively, it is possible to increase the clock ratio value of the DUT 103 during test mode above its optimum value so that its core is operated at full clock speed. As noted above, however, such practice often causes spectral impurities which may cause failures of the DUT 103 since operated at non-optimal levels for its internal circuitry. As described herein, the test system 100 is configured to test the DUT 103 at optimum core clock speeds even though the tester 101 is frequency limited. The frequency of operation of the I/O interface of the DUT 103 is reduced to the appropriate levels for the tester 101. This is inconsequential since the tester 101 is primarily designed for testing the core circuitry of the DUT 103 at the highest frequency possible regardless of the frequency of operation of the system bus 103. The I/O interface of the DUT 103 may be tested by other means.

The tester 101 is configured to initialize (e.g., power up or reset) the DUT 103 and place the DUT 103 into test mode. Test mode may be enabled by any one or more well known means, such as toggling otherwise operative ones of the I/O signals when one or more pre-selected I/O signals (e.g., RESET) are held in a non-operative state. Other methods of enabling test mode are known, such as communicating with the DUT 103 over a test bus (e.g., JTAG, 12C, etc.), and/or various other mechanisms known to those skilled in the art. In the test bus configurations, the illustrated system bus 105 is intended to include the test bus signals. The tester 101 generates and provides the BCLK signal to the DUT 103 at a frequency suitable for the particular DUT 103 (e.g., 100 MHz), and the tester 101 provides one or more clock ratio signals via the system bus 105 or by other means to the DUT 103 from which internal clock ratio values are derived, as further described below. In one embodiment, the clock ratio signals are provided via the system bus 105, such as via one or more address or data signals (e.g. for a microprocessor) during test mode configuration or after the DUT 103 is placed into test mode. In another embodiment, any one or more of the clock ratio values are predetermined and hardwired into the DUT 103 or provided via another mechanism, such as strapping or the like. In a strapping embodiment, certain pins of the DUT 103 are asserted to appropriate values to define the clock ratio value. It is noted that a clock "multiplier" implies multiplying a frequency signal, although in the illustrated embodiment a clock divisor is used in a phase-locked loop (PLL) circuit to achieve frequency multiplication. The generalized term "clock ratio" is used herein which applies to both regardless of how used.

Once the DUT 103 is placed into test mode, the tester 101 runs various test configurations and routines as understood by those skilled in the art to appropriately test the operations of the DUT 103. As described further below, the various clock ratio values, which are either predetermined and/or provided by the tester 101, configure the DUT 103 to operate its core circuitry at full clock speed and configure its internal I/O logic to operate the system bus 105 at a reduced frequency suitable for the tester 101. While in test mode, the tester 101 operates according to a "virtual BCLK" frequency level which is reduced compared to the actual frequency of BCLK provided to the DUT 103. The frequency of the virtual BCLK is compatible with the reduced maximum frequency of operation of the system bus 105. During test, an I/O signal, such as RESET, is employed to synchronize the virtual BCLK to a specific cycle of BCLK. In one embodiment, a de-assertion of RESET indicates that an associated BCLK corresponds with a rising edge of the virtual BCLK. Thus, the tester 101 sets the relationship between cycles of BCLK and cycles of the virtual BCLK to properly perform test operations within the operating frequency of the tester 101.

Figure 2:
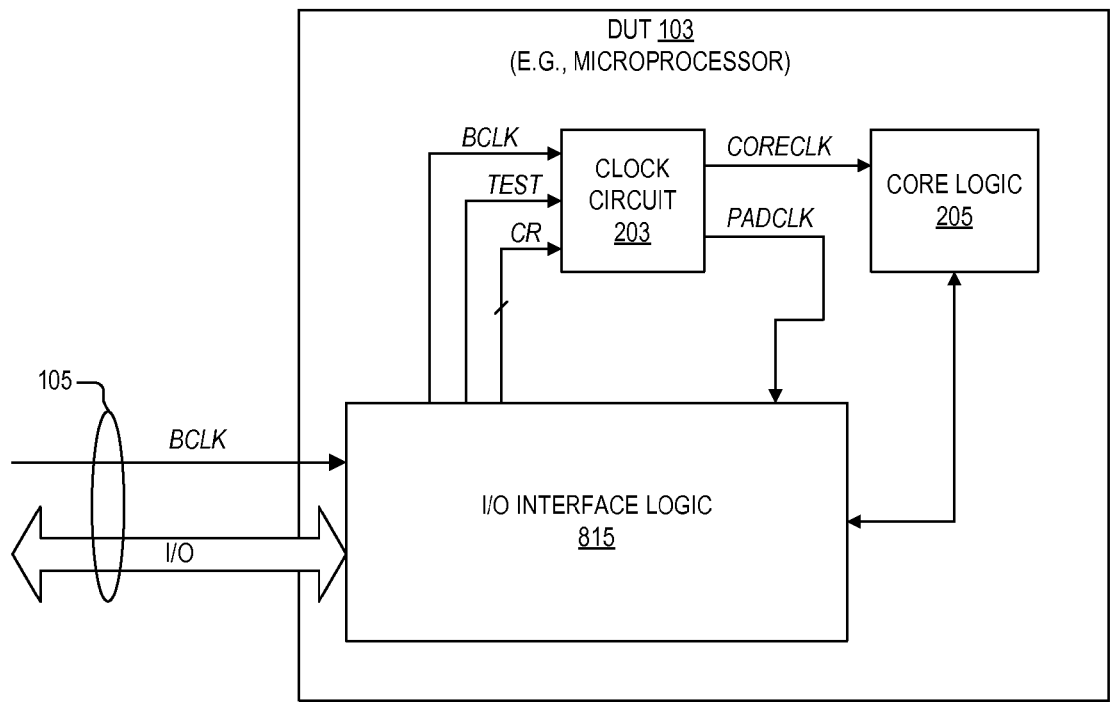
FIG. 2 is a simplified block diagram of the device under test of FIG. 1 implemented according to an exemplary embodiment of the present invention.

FIG. 2 is a simplified block diagram of the DUT 103 implemented according to an exemplary embodiment of the present invention. The DUT 103 includes I/O interface logic 201 for externally interfacing the system bus 105 and for operating the system bus 105 according to the particular type of IC. The I/O interface logic 201 includes the physical aspects of the IC, such as I/O pins, drivers and buffers, etc., and further incorporates the circuitry for operating the system bus 105 according to particular standards or protocols defined for the system bus 105. For example, a microprocessor includes internal bus interface logic coupled to the I/O pins of the microprocessor which interface the system bus 105 and which is configured to execute cycles on the system bus 105 according to predetermined standards and configurations and synchronous with the BCLK signal. The I/O interface logic 201 receives and forwards the BCLK signal to an internal clock circuit 203. The clock circuit 203 generates a core clock signal CORECLK suitable for internal core logic 205. The clock circuit 203 also generates a pad clock signal PADCLK suitable for operating the I/O interface logic 201 at the desired frequency synchronous with the BCLK signal (or the CORECLK signal). The core logic 205 is coupled to the I/O interface logic 201 for various functions, including, for example, controlling information transferred via the system bus 105. An x86-compatible microprocessor has internal core circuitry that operates up to a maximum of a first clock ratio value (e.g., 32) of the frequency of the BCLK signal and internal bus logic that operates up to a maximum of a second clock ratio value (e.g., 8) of the frequency of the BCLK signal, where the first ratio value is generally greater than the second. In specific x86-compatible microprocessor, the second clock ratio value for generating the frequency of the PADCLK signal is eight during normal operation, which is appropriate for enabling quad-pumped transactions on the system bus 105 as known to those skilled in the art.

As previously described, the tester 101 programs or otherwise configures the DUT 103 into a test mode via the system bus 105. When the test indication or condition is provided, the I/O interface logic 201 detects the test condition and asserts an internal test signal TEST to the clock circuit 203. Also, the tester 101 provides one or more clock ratio signals, which are received by the I/O interface logic 201 and forwarded as one or more clock ratio signals CR to the clock circuit 203. In response to assertion of the TEST signal, the clock circuit 203 asserts the CORECLK signal at its highest allowable frequency to enable testing the core logic 205 at full clock speed. The clock circuit 203 reduces the frequency of the PADCLK signal so that the I/O interface logic 201 executes cycles on the system bus 105 at a reduced frequency level appropriate for the tester 101, as further described below.

Figure 3:
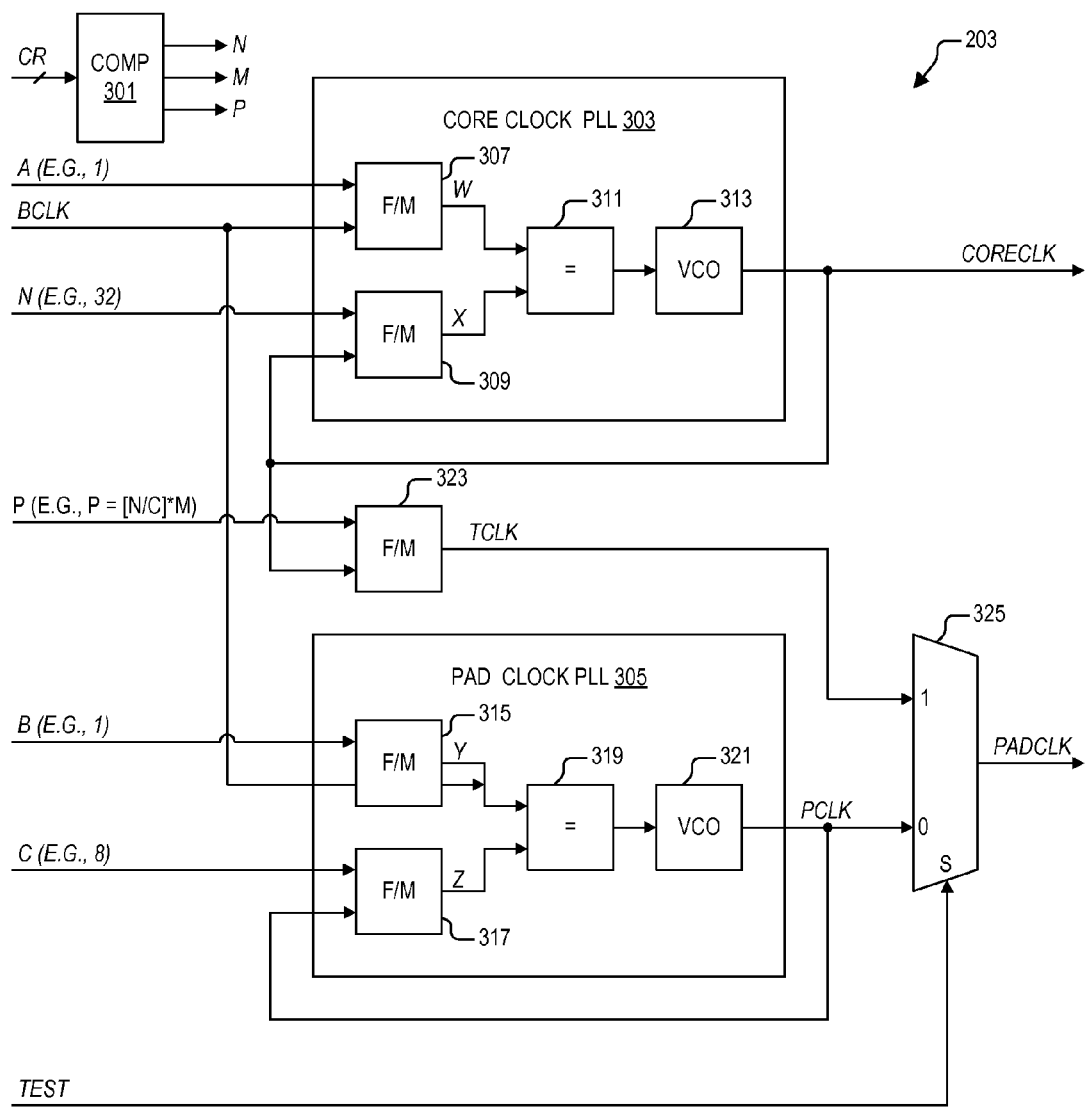
FIG. 3 is a block diagram of the clock circuit of FIG. 2 implemented according to an exemplary embodiment of the present invention for operating according to the frequency of a virtual bus clock during the test mode of operation.

FIG. 3 is a block diagram of the clock circuit 203 implemented according to an exemplary embodiment of the present invention for operating according to the frequency of a virtual bus clock during the test mode of operation. The clock circuit 203 includes a computation (COMP) circuit 301, which receives the CR signals from the I/O interface logic 201 and which provides a first clock ratio value N, a second clock ratio value M, and a third clock ratio value P. The clock circuit 203 further includes a core clock PLL 303 receiving the BCLK signal and the clock ratio value N, and a pad clock circuit 305 receiving the BCLK signal. An internal clock ratio value A is provided to one input of a frequency multiplier element (F/M) 307 receiving the BCLK signal at its other input. The F/M element 307 divides the frequency of BCLK by the value of A and provides a first signal W to one input of a phase comparator 311. The CORECLK signal is provided to one input of another F/M element 309 which receives the clock ratio value N at its other input. The F/M element 309 divides the frequency of CORECLK by the value N and provides a second signal X to the other input of the phase comparator 311. The phase comparator 311 has a phase indication output driving the input of a voltage controlled oscillator (VCO) 313, which has an output providing the CORECLK signal. In operation, the F/M divisor 307 divides BCLK by the value of A (e.g., A=1) to provide the W signal at a frequency which is a suitable multiple of BCLK. The F/M element 309 divides the frequency of CORECLK by the value N for developing the X signal at A/N times the frequency of BCLK. In this manner, the value of N, though used as a clock divisor within the core clock PLL 303 to divide down the frequency of CORECLK, actually multiplies the frequency of BCLK by N to develop the frequency of the CORECLK signal.

In one embodiment, in normal operating mode, the DUT 103 according to an embodiment of the present invention is designed to optimally operate at values of N up to 32, a BCLK frequency up to 100 MHz, and a clock ratio value A equal to one, although other embodiments are contemplated. Thus, with a 100 MHz bus clock and a value of N up to 16 (and A=1), the core clock PLL 303 generates the CORECLK signal in phase with the BCLK signal and with a frequency of 1.6 GHz. If the value of N is increased up to 32, then the CORECLK signal has a frequency of 3.2 GHz.

For the pad clock PLL 305, an internal clock ratio value B is provided to one input of another F/M element 315 receiving the BCLK signal at its other input. The F/M element 315 divides the frequency of BCLK by the value of B and provides a third signal Y to one input of a phase comparator 319. A preliminary pad clock signal PCLK is provided to one input of another F/M element 317, which receives another internal clock ratio value C at its other input. The F/M element 317 divides the frequency of PCLK by the value of C and provides a fourth signal Z to the other input of the phase comparator 319. The phase comparator 319 has a phase indication output driving the input of another VCO 321, which has an output providing the PCLK signal.

In one embodiment, BCLK is 100 MHz, the value of B is equal to one, and the value of C is equal to 8, so that the pad clock PLL 305 generates the PCLK signal a frequency of 800 MHz and in phase with the BCLK signal. The PCLK signal is provided to the I/O interface logic 201 for conducting cycles on the system bus 105 during normal operation (i.e., when not in test mode). For test mode, however, the frequency of the signals provided to/from the tester 101 over the system bus 105 must not exceed the limitations of the tester 101. One skilled in the art will appreciate that present day system buses, such as an x86-compatible system bus, operate at roughly four times the speed of BCLK. And most present day testers, as noted above, provide for system bus interfaces up to approximately 200 MHz. And to operate at this speed, a PCLK must be generated that is 8 times the frequency of BCLK. For these embodiments, a C value of 8 is provided as the clock ratio value to the F/M element 317 within the pad clock PLL 305 to generate PCLK in phase with BCLK.

Another F/M element 323 is provided within the clock circuit 203, which receives the CORECLK signal at one input and the clock ratio value P at its other input. The F/M element 323 divides the frequency of CORECLK by P and generates a test clock signal TCLK. TCLK is provided to a logic one (1) input of a multiplexer (MUX) 325 and the PCLK signal is provided to a logic zero (0) input of the MUX 325. The MUX 325 receives the TEST signal at its select input for selecting between the TCLK and PCLK signals as the PADCLK signal. The TCLK signal is selected as the PADCLK signal during the test condition when the TEST signal is asserted high and otherwise the PCLK signal is selected during normal operation when the TEST signal is asserted low. The PADCLK signal is provided to the I/O interface logic 201 and used to drive signals on the system bus 105. Thus, the F/M element 323 serves as a test clock circuit used to generate the test clock suitable for the test mode.

As noted above, if the clock ratio value C is 8, then the PCLK signal has a frequency that is eight times that of BCLK. And if BCLK has a frequency of 100 MHz, then PCLK is 800 MHz which is above the maximum operating frequency of the tester 101. P has a value to sufficiently divide down the frequency of CORECLK to a frequency for PADCLK that is suitable for operating the system bus 105 with the tester 101 during test mode. In one embodiment, the value of P is based on the values of the clock ratio values M, N and C, such as according to the equation P=(N/C)*M in which an asterisk "*" denotes multiplication. Since P operates as a divisor, it divides the CORECLK signal by N (to the frequency of BCLK) and also multiplies by C/M. The clock ratio value M has a value that relates the frequency of BCLK to the virtual BCLK which is used by the tester 101 during the test mode of operation. As previously noted, M is defined by design or other mechanism such as strapping, etc. In one embodiment, M is set to 2 and C=8. Thus, in the M=2 and C=8 example, there is one cycle of the "virtual BCLK" for every two cycles of the BCLK provided by the tester 101. As previously noted, during test, an I/O signal (e.g., RESET) is employed to synchronize the virtual BCLK to a specific cycle of BCLK according to the value of M, so that the tester 101 can set the relationship between cycles of BCLK and cycles of the virtual BCLK. If the BCLK signal has a frequency of 100 MHz and for M=2 and C=8, then TCLK has a frequency of 400 MHz which is suitable for the tester 101 in the illustrated embodiment.

In an alternative embodiment, the BCLK signal may instead be provided to the F/M element 323 rather than CORECLK, in which case the clock ratio value P has a value of P=C/M. In either case, the ratio value M is used to set the relationship between the frequencies of BCLK and the virtual BCLK used by the tester 101.

The purpose of employing signal TEST and associated elements when the DUT 103 is coupled to the tester 101 is to provide a test mode that enables the core logic 205 within the DUT 103 to operate at full speed, while still maintaining operation of the system bus 105 at a frequency that is within the limitations of the tester 100. In one embodiment, the tester 101 is programmed to generate the BCLK signal and to provide clock ratio signals that allow for generation of CORECLK and operation of internal hardware 1) that is within the optimum range of clock ratio values associated with the core clock PLL 303, and 2) that allows for testing of the internal core logic 205 at the upper limits of its frequency range. Accordingly, when TEST is asserted, the DUT 103 is provided with a BCLK that generates a CORECLK to stimulate the core logic 205 at full speed, while those signals on the system bus 105 are provided at a speed which the tester 101 can handle.

For instance, using the numbers provided above, if BCLK is provided at 100 MHz along with a clock ratio value of N=32, a 3.2 GHz CORECLK is generated by the core clock PLL 303. And the pad clock PLL 305 generates a PCLK signal that is 800 MHz, which is too high for the tester 101. Cutting BCLK to 50 MHz would result in a PCLK of 400 MHz, which is compatible with the capabilities of the tester 101, but would result in a 1.6 GHz CORECLK. If the core logic 205 is configured to operate up to 3.2 GHz, then test operation at only 1.6 GHz is not fast enough to ensure proper results at full clock speed. But, providing a 100 MHz BCLK with clock ratio values of N=64 and M=2 and asserting the TEST signal allows for a CORECLK 3.2 GHz, a 50 MHz virtual BCLK, and a 400 MHz TCLK. Thus, a PADCLK is provided that is only 4 times the frequency of BCLK (i.e., 400 MHz), and that is also eight times the frequency of the virtual BCLK.

An advantage of the present invention is that the mechanisms described herein allow for testing internal logic of an integrated circuit at full speed without incurring false failures due to core clock jitter or other aberrations caused by driving the PLL for the core clock outside of its optimum operating range. In addition, the present invention provides the above advantages while also providing for a system bus interface to a tester that is within the capabilities of a tester.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. An integrated circuit (IC), comprising:
   input/output (I/O) interface logic which receives an external bus clock signal having a first frequency, which receives and operates according to a pad clock signal, and which is configured to detect a test mode and to internally provide a test signal if said test mode is detected; and
   a clock circuit, coupled to said I/O interface logic, comprising:
      a core clock circuit which generates a core clock signal at a second frequency based on said bus clock signal and a first clock ratio value;
      a pad clock circuit which generates a preliminary clock signal at a third frequency based on said bus clock signal and a second clock ratio value;
      a test clock circuit which generates a test clock signal at a fourth frequency based on said first frequency, said second clock ratio value and a third clock ratio value in which said fourth frequency is suitable for operating said I/O interface logic during said test mode; and
      a select circuit which selects, based on said test signal, between said test clock signal and said preliminary clock signal as said pad clock signal.

2. The IC of claim 1, wherein said second frequency is a full speed operating frequency of core circuitry of the IC.

3. The IC of claim 1, wherein said core clock circuit comprises:
   a frequency divider which divides said second frequency of said core clock signal by said first clock ratio value to provide a divided clock signal;
   a phase comparator which compares phases of said bus clock signal and said divided signal and which provides a phase indication signal; and
   a voltage controlled oscillator having an input receiving said phase indication signal and an output providing said core clock signal.

4. The IC of claim 1, wherein said pad clock circuit comprises:
   a frequency divider which divides said third frequency of said preliminary clock signal by said second clock ratio value to provide a divided clock signal;
   a phase comparator which compares phases of said bus clock signal and said divided signal and which provides a phase indication signal; and
   a voltage controlled oscillator having an input receiving said phase indication signal and an output providing said preliminary clock signal.

5. The IC of claim 1, wherein said test clock circuit comprises:
   a computation block which multiplies said first and third clock ratio values together and which divides by said second clock ratio value to provide a test clock ratio value; and
   a frequency divider which divides said second frequency of said core clock signal by said test clock ratio value to provide said test clock signal.

6. The IC of claim 1, wherein at least one external clock ratio signal is received via said I/O interface logic during said test mode which is used to derive said first and third clock ratio values.

7. The IC of claim 1, wherein said second and third clock ratio values are preconfigured on the IC.

8. A test system, comprising:
   a device under test, comprising:

input/output (I/O) interface logic which receives an external bus clock signal having a first frequency, which receives and operates according to a pad clock signal, and which is configured to detect a test mode and to internally provide a test signal if said test mode is detected; and a clock circuit, coupled to said I/O interface logic, comprising:
- a core clock circuit which generates a core clock signal at a second frequency based on said bus clock signal and a first clock ratio value;
- a pad clock circuit which generates a preliminary clock signal at a third frequency based on said bus clock signal and a second clock ratio value;
- a test clock circuit which generates a test clock signal at a fourth frequency based on said first frequency, said second clock ratio value and a third clock ratio value in which said fourth frequency is suitable for operating said I/O interface logic during said test mode; and
- a select circuit which selects, based on said test signal, between said test clock signal and said preliminary clock signal as said pad clock signal; and a tester for testing said device under test, which provides said bus clock signal and which indicates said test mode to said device under test via said I/O interface logic.

9. The test system of claim 8, wherein said tester provides a clock ratio signal to said device under test via said I/O interface logic.

10. The test system of claim 9, wherein said device under test derives said first and third clock ratio values from said clock ratio signal.

11. The test system of claim 8, wherein said second and third clock ratio values are preconfigured on said device under test.

12. The test system of claim 8, wherein said core and pad clock circuits are each phase-locked loop circuits.

13. The test system of claim 8, wherein said tester is capable of operating up to a frequency that is greater than or equal to said fourth frequency but less than said third frequency.

14. The test system of claim 8, wherein said tester interfaces said I/O interface logic at a virtual frequency that is determined by dividing said first frequency by said third clock ratio value.

15. The test system of claim 8, wherein said test clock circuit comprises a frequency divider which divides said second frequency of said core clock signal by a fourth clock ratio value based on said first, second and third clock ratio values.

16. A method of testing an integrated circuit (IC), the IC having a clock input for receiving a bus clock signal up to a first frequency, internal core circuitry operative up to a second frequency which is a first multiple of said first frequency, and an input/output (I/O) interface operative up to a third frequency which is a second multiple of said first frequency, said method comprising:
- providing the bus clock signal to the IC at the first frequency and providing the first multiple to the IC to enable operation of the internal core circuitry up to the second frequency;
- programming the IC to operate in a test mode via the I/O interface;
- providing a test clock signal at a fourth frequency which is reduced relative to the third frequency by a third multiple; and
- providing the test clock signal to the I/O interface within the IC when in the test mode.

17. The method of claim 16, further comprising determining the third multiple as a ratio between the first frequency and a frequency of a virtual bus clock used for testing the IC.

18. The method of claim 16, further comprising:
- providing the third multiple to the IC as a ratio between the first frequency and a frequency of a virtual bus clock used for testing the IC; and
- determining the fourth frequency by dividing the second frequency by a fourth multiple which is determined as the first and third multiples multiplied together and divided by the second multiple.

19. The method of claim 16, further comprising:
- providing the third multiple to the IC as a ratio between the first frequency and a frequency of a virtual bus clock used for testing the IC; and
- determining the fourth frequency by dividing the first frequency by a fourth multiple which is determined as a ratio between the second and third multiples.

20. The method of claim 16, wherein said programming the IC to operate in a test mode comprises providing a test indication via the I/O interface and asserting a test signal within the IC in response to the test indication.

* * * * *